(12) United States Patent
Lai et al.

(10) Patent No.: US 11,841,270 B1
(45) Date of Patent: Dec. 12, 2023

(54) SPECTROMETER

(71) Applicant: VisEra Technologies Company Ltd., Hsin-Chu (TW)

(72) Inventors: Lai-Hung Lai, Hsin-Chu (TW); Hsin-Yi Hsieh, Hsin-Chu (TW); Chin-Chuan Hsieh, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 0 days.

(21) Appl. No.: 17/824,614

(22) Filed: May 25, 2022

(51) Int. Cl.
| | | |
|---|---|---|
| *G02B 6/42* | (2006.01) | |
| *G01J 3/28* | (2006.01) | |
| *G02B 27/30* | (2006.01) | |
| *G01J 3/18* | (2006.01) | |
| *G01J 3/02* | (2006.01) | |
| H01L 27/146 | (2006.01) | |
| H10K 39/32 | (2023.01) | |

(52) U.S. Cl.
CPC ........... *G01J 3/2823* (2013.01); *G01J 3/0208* (2013.01); *G01J 3/18* (2013.01); *G02B 6/42* (2013.01); *G02B 6/4215* (2013.01); *G02B 27/30* (2013.01); *H01L 27/14625* (2013.01); *H10K 39/32* (2023.02)

(58) Field of Classification Search
CPC ......... H01L 27/146; G01J 3/0256; G01J 3/18; G01J 3/2823; G01J 2003/1861; G01J 2003/2826; G02B 6/4215
See application file for complete search history.

(56) References Cited

U.S. PATENT DOCUMENTS

2017/0160133 A1 * 6/2017 Lin ...................... G02B 5/1828
2020/0075656 A1 * 3/2020 Lee ................... H01L 27/14623
(Continued)

FOREIGN PATENT DOCUMENTS

DE 202008003977 U1 * 8/2009 ................ G01J 3/02
JP H08297204 11/1996
(Continued)

OTHER PUBLICATIONS

J. Schwider, "Dispersive interferometric profilometer", Jul. 1, 1994 (Year: 1994).*
(Continued)

*Primary Examiner* — Maurice C Smith
(74) *Attorney, Agent, or Firm* — LIU & LIU (57) ABSTRACT

The spectrometer includes a lightguide substrate, an upper grating layer, a lower grating layer, an image sensor, and a readout circuit. The upper grating layer is disposed on the lightguide substrate and configured to receive a light. The upper grating layer includes a first grating structure, a second grating structure, and a third grating structure, and the first, second, and third grating structures have different grating periods. The lightguide substrate is configured to diffract the light when the light propagates into the lightguide substrate, such that multiple diffraction lights are formed and each of the multiple diffraction lights has different wavelengths and different optical path. The lower grating layer is disposed under the lightguide substrate and configured to emit the multiple diffraction lights. The image sensor is disposed under the lower grating layer. The readout circuit is disposed under the image sensor.

19 Claims, 12 Drawing Sheets

(56) References Cited

U.S. PATENT DOCUMENTS

2020/0340859 A1   10/2020  Meng et al.
2021/0223104 A1    7/2021  Siddique et al.

FOREIGN PATENT DOCUMENTS

| | | |
|---|---|---|
| JP | H10-111176 | 4/1998 |
| JP | H10111420 | 4/1998 |
| JP | 2011089895 | 5/2011 |
| JP | 2019500612 | 1/2019 |
| WO | 2015037306 | 3/2015 |
| WO | 2017138668 | 8/2017 |
| WO | 2021102088 | 5/2021 |

OTHER PUBLICATIONS

Yang Chen et al., "High-efficiency apodized-imaging chip-fiber grating coupler for silicon nitride waveguides", Optics Letters, vol. 41, No. 21 (2016), pp. 5059-5062.
Mohammadsadegh Faraji-Dana et al., "Compact folded metasurface spectrometer", Nature Communications, vol. 9, No. 4196 (2018), pp. 1-8.

\* cited by examiner

SPECTROMETER

BACKGROUND

Field of Invention

The present disclosure relates to a spectrometer. More particularly, the present disclosure relates to a spectrometer having three different grating structures.

Description of Related Art

In general, a spectrum of light can be analyzed by a variety of analytical instruments. For example, traditional reflection grating spectroscopy can analyze wavelengths of visible light or near-infrared (NIR) light, and Fourier-transform infrared spectroscopy (FTIR) (such as Michelson interferometer) can analyze wavelengths of infrared light (IR). However, no analytical instrument can analyze broadband spectrum from ultraviolet-visible-infrared light. In addition, the analytical tools above are bulky and expansive. Therefore, there is a need to solve the above problems.

SUMMARY

One aspect of the present disclosure is to provide a spectrometer. The spectrometer includes a lightguide substrate, an upper grating layer, a lower grating layer, an image sensor, and a readout circuit. The upper grating layer is disposed on the lightguide substrate and configured to receive light. The upper grating layer includes a first grating structure, a second grating structure, and a third grating structure, and the first, second, and third grating structures have different grating periods. The lightguide substrate is configured to diffract the light when the light propagates into the lightguide substrate, such that multiple diffraction lights are formed and each of the multiple diffraction lights has different wavelengths and different optical path. The lower grating layer is disposed under the lightguide substrate and configured to emit the multiple diffraction lights. The image sensor is disposed under the lower grating layer. The readout circuit is disposed under the image sensor.

In some embodiments, the first grating structure is a 2 steps grating structure and is configured to receive UV light and visible light.

In some embodiments, a grating period of the first grating structure is in a range from 0.3 μm to 0.4 μm.

In some embodiments, the second grating structure is a 3 steps grating structure and is configured to receive near-infrared light.

In some embodiments, a grating period of the second grating structure is in a range from 0.6 μm to 0.7 μm.

In some embodiments, the third grating structure is a 3 steps grating structure and is configured to receive short-wave infrared light.

In some embodiments, a grating period of the third grating structure is in a range from 0.95 μm to 1.05 μm.

In some embodiments, the spectrometer further includes a collimator disposed above the lightguide substrate, in which the collimator is configured to confine an incident angle of the light, and the collimator includes at least three openings respectively aligned the first grating structure, the second grating structure, and the third grating structure.

In some embodiments, the collimator is configured to confine the incident angle of the light in a range between ±2 degrees or smaller.

In some embodiments, the spectrometer further includes a top cladding layer disposed between the collimator and the lightguide substrate.

In some embodiments, the lightguide substrate has a critical angle of the light in a range from 32 degrees to 75 degrees.

In some embodiments, a thickness of the lightguide substrate is in a range from 100 μm to 2 mm.

In some embodiments, a length of the lightguide substrate is in a range from 500 μm to 2000 μm.

In some embodiments, the first grating structure, the second grating structure, and the third grating structure have a same height.

In some embodiments, a refractive index of the upper grating layer is in a range from 1.5 to 2.7.

In some embodiments, a refractive index of the lightguide substrate is in a range from 1.5 to 2.7.

In some embodiments, a material of the upper grating layer is the same as a material of the lightguide substrate.

In some embodiments, a material of the upper grating layer is different from a material of the lightguide substrate.

In some embodiments, the image sensor is a quantum dot image sensor, a Perovskite image sensor, or an organic photodiode image sensor.

In some embodiments, the image sensor comprises a Si photodiode array and a Ge on Si photodiode array laterally overlapping the Si photodiode array.

In some embodiments, the spectrometer further includes a bandpass filter layer disposed between the lower grating layer and the image sensor.

In some embodiments, the spectrometer further includes a bottom cladding layer disposed between the lower grating layer and the bandpass filter layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The analysis of a spectrum of a light could be limited by the types of analytical instruments. Traditional reflection grating spectroscopy only can detect limited wavelength range, such as visible light or near infrared (NIR) light. In order to measure broadband spectrum, a grating structure and a detector array can be used in the reflection grating spectroscopy. Another technique for IR spectroscopy is Fourier transform infrared (FTIR). FTIR uses Michelson interferometer for interferogram measurement, which converts light signals to wavenumber space by Fourier transform. However, traditional reflection grating spectroscopy and FTIR are bulky and expansive. Therefore, it is impossible to be integrated into a portable device. On-chip micro-electro-mechanical system Fourier transform infrared (MEMS FTIR) spectrometer-based gas sensing can be applied for infrared wavelength measurement. However, MEMS FTIR has a limitation for visible wavelength measurement due to the moving mirror's resolution.

As for miniaturized spectrometer, the angle required to couple into waveguide decreases as the wavelength of light increases. A coupling efficiency (it can also referred to as "integration efficiency") of a grating structure and a planer waveguide has an impact on miniaturized spectrometer. The coupling efficiency is one of the important reasons that would affect the resolution of the analysis results. It is understood that the coupling efficiency is restricted by grating equations and planer waveguide propagation equations. In addition, the geometry of the grating would affect the coupling efficiency.

The present disclosure provides a spectrometer, and the spectrometer can measure a broadband spectrum from ultra-violet-visible-infrared light. The disclosed spectrometer includes different grating structures having multiple steps and different grating periods. The disclosed spectrometer also has a high coupling efficiency of a grating structure and a planer waveguide (lightguide substrate), therefore, it could provide high resolution of the analysis results.

Hereinafter, several embodiments of the present disclosure will be disclosed with the accompanying drawings. Many practical details will be described in the following description for a clear description. However, it should be understood that these practical details should not be used to limit the present disclosure. That is, in some embodiments of the present disclosure, these practical details are unnecessary. In addition, in order to simplify the drawings, some conventional structures and elements will be shown in the drawings in a simple schematic manner.

Figure 1:
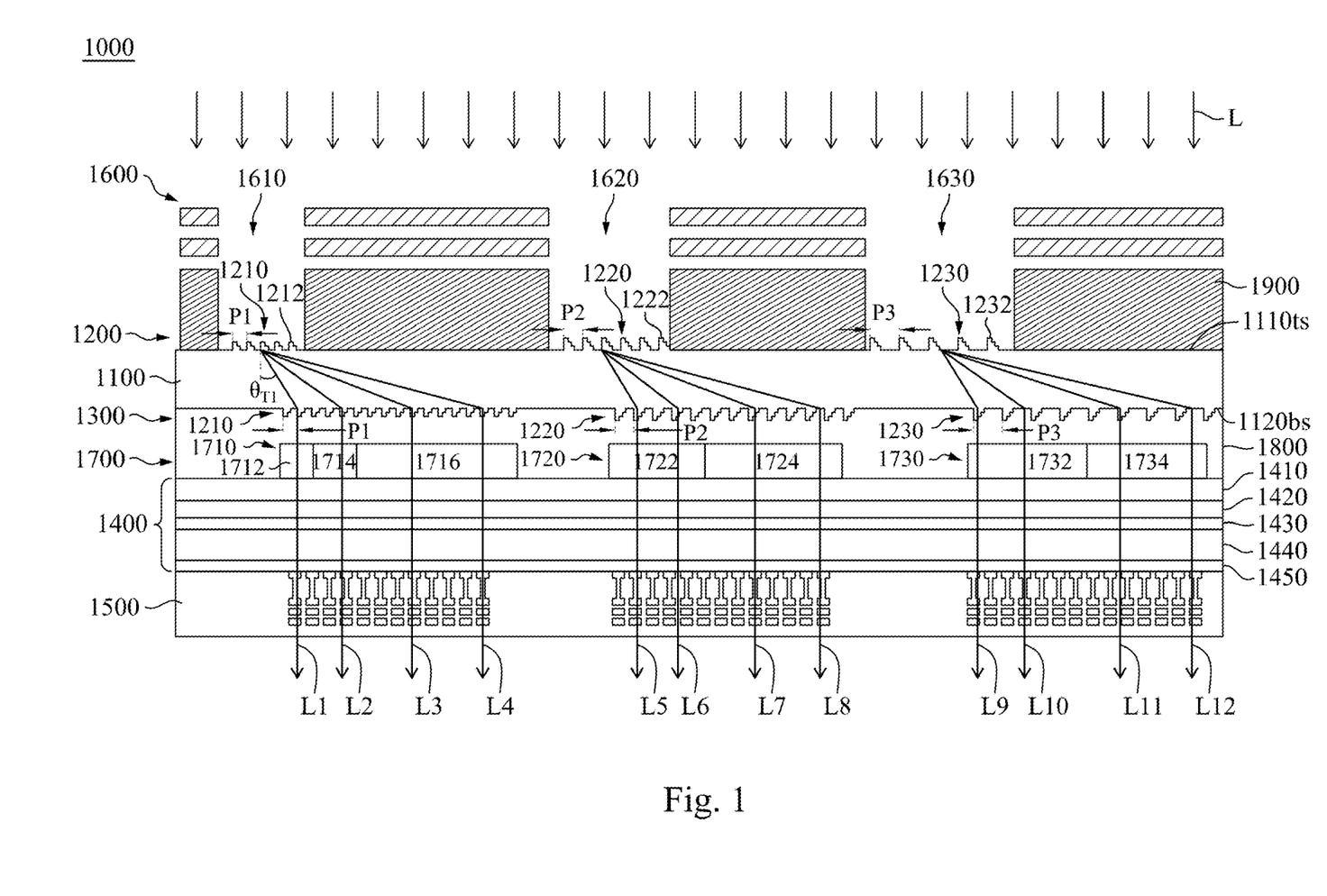
FIG. 1 is a cross-sectional view of a spectrometer in accordance with some embodiments of the present disclosure.

With reference to FIG. 1, FIG. 1 is a cross-sectional view of a spectrometer 1000 in accordance with some embodiments of the present disclosure. The spectrometer 1000 includes a lightguide substrate 1100, an upper grating layer 1200, a lower grating layer 1300, an image sensor 1400, and a readout circuit 1500. The upper grating layer 1200 is disposed on the lightguide substrate 1100 and is configured to receive a light L. The upper grating layer 1200 includes at least three n steps grating structures, in which n is greater than 2. The upper grating layer 1200 includes a first grating structure 1210, a second grating structure 1220, and a third grating structure 1230. The first grating structure 1210, the second grating structure 1220, and the third grating structure 1230 have different grating periods. The lightguide substrate 1100 is configured to diffract the light L when the light L propagates into the lightguide substrate 1100, such that multiple diffraction lights L1-L12 are formed and each of the multiple diffraction lights L1-L12 has different wavelengths and different optical path. The detailed structure of the first grating structures 1210, the second grating structure 1220, and the third grating structure 1230 will be described in FIG. 3A to FIG. 3C below. In some embodiments, the light L includes the wavelength in a range from 350 nm to 2000 nm.

Figure 2A:
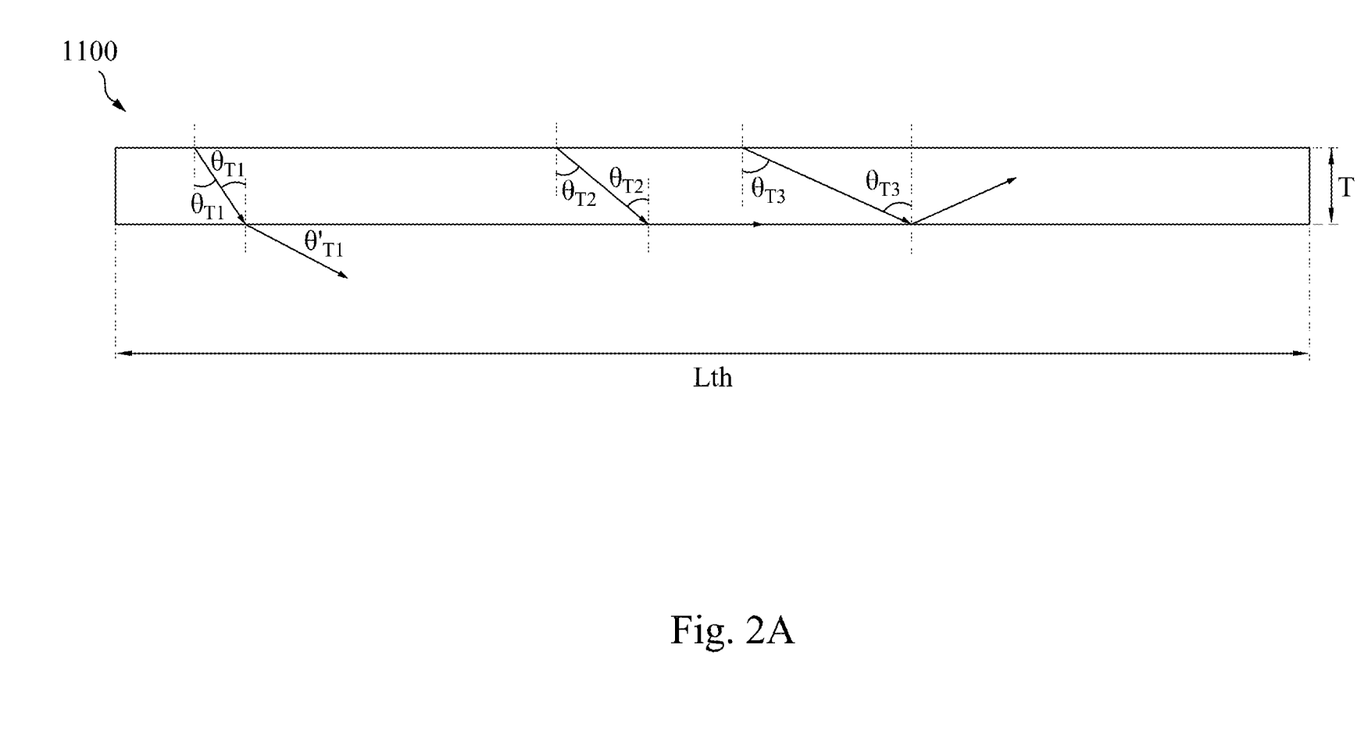
FIG. 2A is a partial enlargement view of a lightguide substrate of the spectrometer in FIG. 1.

The lightguide substrate 1100 in FIG. 1 may be a transparent substrate. The lightguide substrate 1100 also can be referred to as a planer waveguide. In some embodiments, the lightguide substrate 1100 may be a sapphire substrate, calcium fluoride, UV-fused silica, magnesium fluoride, barium fluoride, potassium bromide, calcite, N-BK7, glass, or other ceramic materials. In some embodiments, the lightguide substrate 1100 has a high refractive index (n), and the refractive index of the lightguide substrate 1100 is in a range from 1.5 to 2.7. With reference to FIG. 2A, FIG. 2A is a partial enlargement view of the lightguide substrate 1100 of the spectrometer 1000 in FIG. 1. In some embodiments, the lightguide substrate 1100 has a critical angle $\theta_c = \sin^{-1}(1/n)$, where n is the refractive index of lightguide substrate 1100. Assuming incident angle $\theta^{T1} < \theta^{T2} < \theta^{T3}$, and $\theta^{T2} = \theta_c$. For the light L with $\theta^{T3}$ larger than $\theta_c$, light L would occur total internal reflection (TIR) at interface; while for the light with $\theta^{T1}$ smaller than $\theta_c$, the light transmits into another media with a refraction angle $\theta^{T1}=\text{Sin}^{-1}$ (n Sin $\theta^{T1}$). For example, if n=1.9, the critical angle of the lightguide substrate is 31.8°. If the incident angle $\theta_T$ is larger than 31.8°, the total reflection occurs.

It should be understood that the light L becomes multiple diffraction lights L1-L12 in the lightguide substrate 1100 when the light L propagate into the lightguide substrate 1100, as shown in FIG. 1. Each of the diffraction lights L1-L12 has different wavelengths and has different optical path in the lightguide substrate 1100. The light L in FIG. 1 does not occur total internal reflection (TIR) in the lightguide substrate 1100, and directly grating out of the lightguide substrate 1100 through the lower grating layer 1300.

Still refer to FIG. 2A. In some embodiments, a thickness T of the lightguide substrate 1100 is in a range from 100 μm to 2 mm. If the thickness T of the lightguide substrate 1100 is less than 100 μm, the spatial resolution of the diffraction lights L1-L12 may be decreased. If the thickness T of the lightguide substrate 1100 is greater than 2 mm, it may not have a positive impact on the overall size of the spectrometer 1000. A length Lth of the lightguide substrate 1100 is in a range from 500 μm to 2000 μm. If the length Lth of the lightguide substrate 1100 is less than 500 μm, the light L would not have sufficient length to occur total internal reflection in the lightguide substrate 1100. If the length Lth of the lightguide substrate 1100 is greater than 2000 μm, it may not have a positive impact on the spatial resolution of the diffraction lights L1-L12.

In some embodiments, the upper grating layer 1200 in FIG. 1 has a high refractive index (n). In some embodiments, the refractive index of the upper grating layer 1200 is in a range from 1.5 to 2.7. In some embodiments, the upper grating layer 1200 can be made of high n polymer, SiN, NbO, TaO, TiO, or other suitable materials. In some embodiments, the refractive index of the upper grating layer 1200 is similar to or the same as the refractive index of the lightguide substrate 1100. In some embodiments, a material of the upper grating layer 1200 is the same as a material of the lightguide substrate 1100. In some embodiments, a material of the upper grating layer 1200 is different from a material of the lightguide substrate 1100.

Figure 3A:
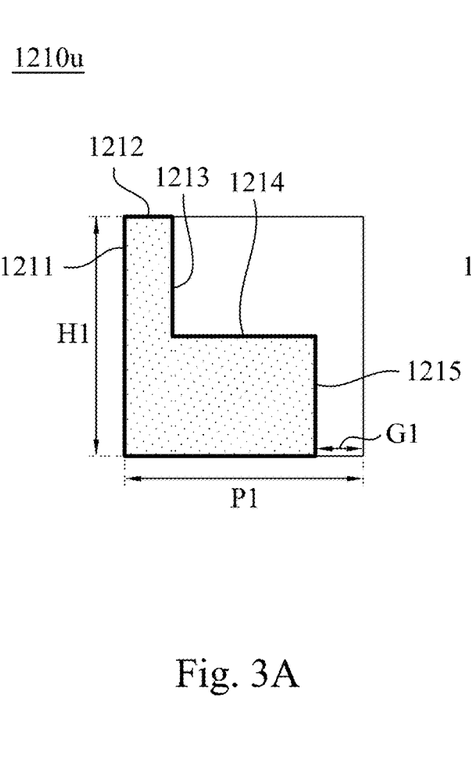
FIG. 3A, FIG. 3B, and FIG. 3C respectively are enlargement views of a first grating structure, a second grating structure, and a third grating structure of an upper grating layer of the spectrometer in FIG. 1.
Figure 3B:
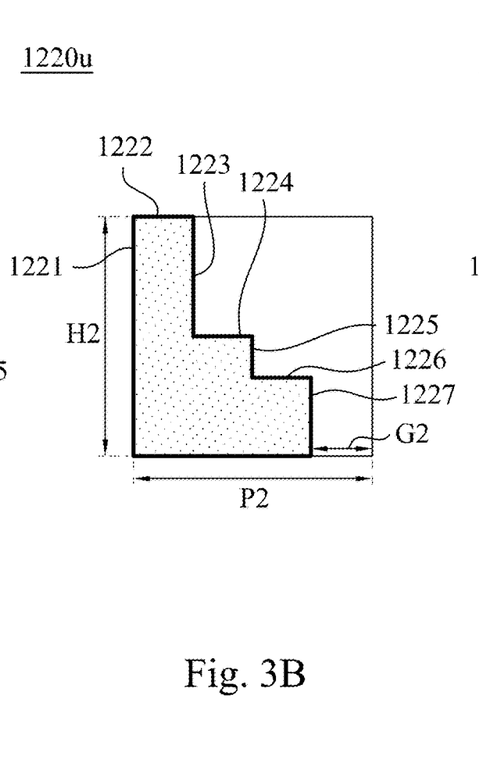
Figure 3C:
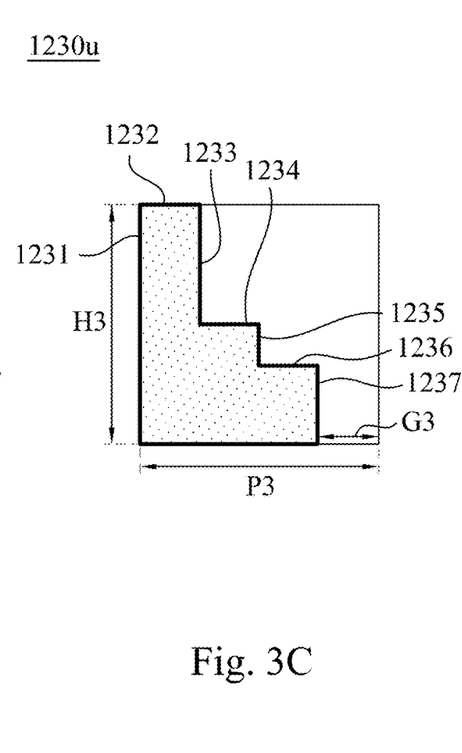

With reference to FIG. 3A to FIG. 3C, FIG. 3A to FIG. 3C respectively are enlargement views of the first grating structure 1210, the second grating structure 1220, and the third grating structure 1230 of the upper grating layer 1200 of the spectrometer 1000 in FIG. 1. Specifically, a first grating structure unit 1210u, a second grating structure unit 1220u, and a third grating structure unit 1230u in FIG. 3A to FIG. 3C respectively are repeat units of the first grating structure 1210, the second grating structure 1220, and the third grating structure 1230. It should be understood that the number of the first grating structure unit 1210u, a second grating structure unit 1220u, and the third grating structure unit 1230u shown in FIG. 1 is not limited in the present disclosure.

As shown in FIG. 3A, the first grating structure unit 1210u is a 2 steps grating structure and is configured to receive UV light and visible light of the light L. In some embodiments, the first grating structure unit 1210u can receive the wavelength in a range from 350 nm to 610 nm and provide a high coupling efficiency with the configuration of the lightguide substrate 1100. Specifically, the first grating structure unit 1210u could provide a high coupling efficiency of the first order (T1) diffraction when the wavelength is in a range from 350 nm to 610 nm. The first grating structure unit 1210u has a sidewall 1211, a surface 1212, a sidewall 1213, a surface 1214, and a sidewall 1215. In one embodiment, a ratio of a width of the surface 1212, a width of the surface 1214, and a gap G1 is 1:3:1, as shown in FIG. 3A. It should be understood that other ratios of the width of the surface 1212, the width of the surface 1214, and the gap G1 are also included in the present disclosure. In some embodiments, a height H1 of the sidewall 1211 is in a range from 0.1 μm to 1 μm, for example, 0.4 μm. In some embodiments, a grating period P1 of the first grating structure 1210 is in a range from 0.3 μm to 0.4 μm, such as, 0.31, 0.32, 0.33, 0.34, 0.35, 0.36, 0.37, 0.38, or 0.39 μm. It should be understood that the grating period P1 herein refers to a distance between corresponding sidewalls 1211 of two adjacent first grating structure units 1210u, as shown in FIG. 1. In some embodiments, the surface 1212 of the first grating structure 1210 is higher than a top surface 1110ts of the lightguide substrate 1100, as shown in FIG. 1.

Figure 3D:
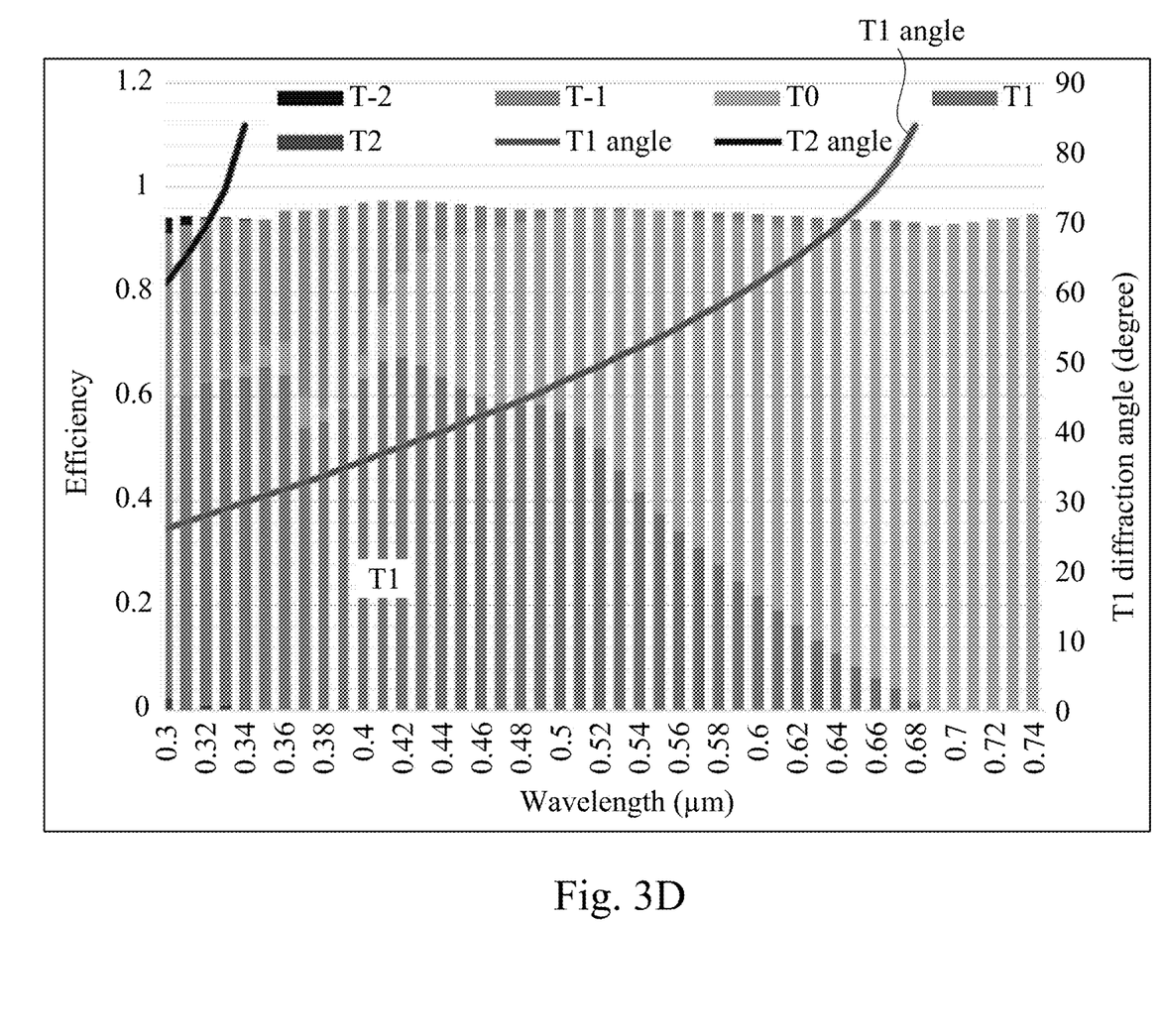
FIG. 3D, FIG. 3E, and FIG. 3F respectively are result pictures of the first grating structure unit, the second grating structure unit, and the third grating structure unit in FIG. 3A, FIG. 3B, and FIG. 3C in accordance with some examples of the present disclosure.

With reference to FIG. 3D, FIG. 3D is a result picture of the first grating structure unit 1210u in FIG. 3A in accordance with one example of the present disclosure. Specifically, in the case of the height H1 is 0.4 μm, and the ratio of the width of the surface 1212, the width of the surface 1214, and the gap G1 is 1:3:1, the first grating structure unit 1210u can allow most of T1 diffraction light within the wavelength between 350 nm to 610 nm propagating into the lightguide substrate 1100 and inhibit high order diffraction light (such as T2 diffraction light) propagating into the lightguide substrate 1100, as shown in FIG. 3D.

Figure 2B:
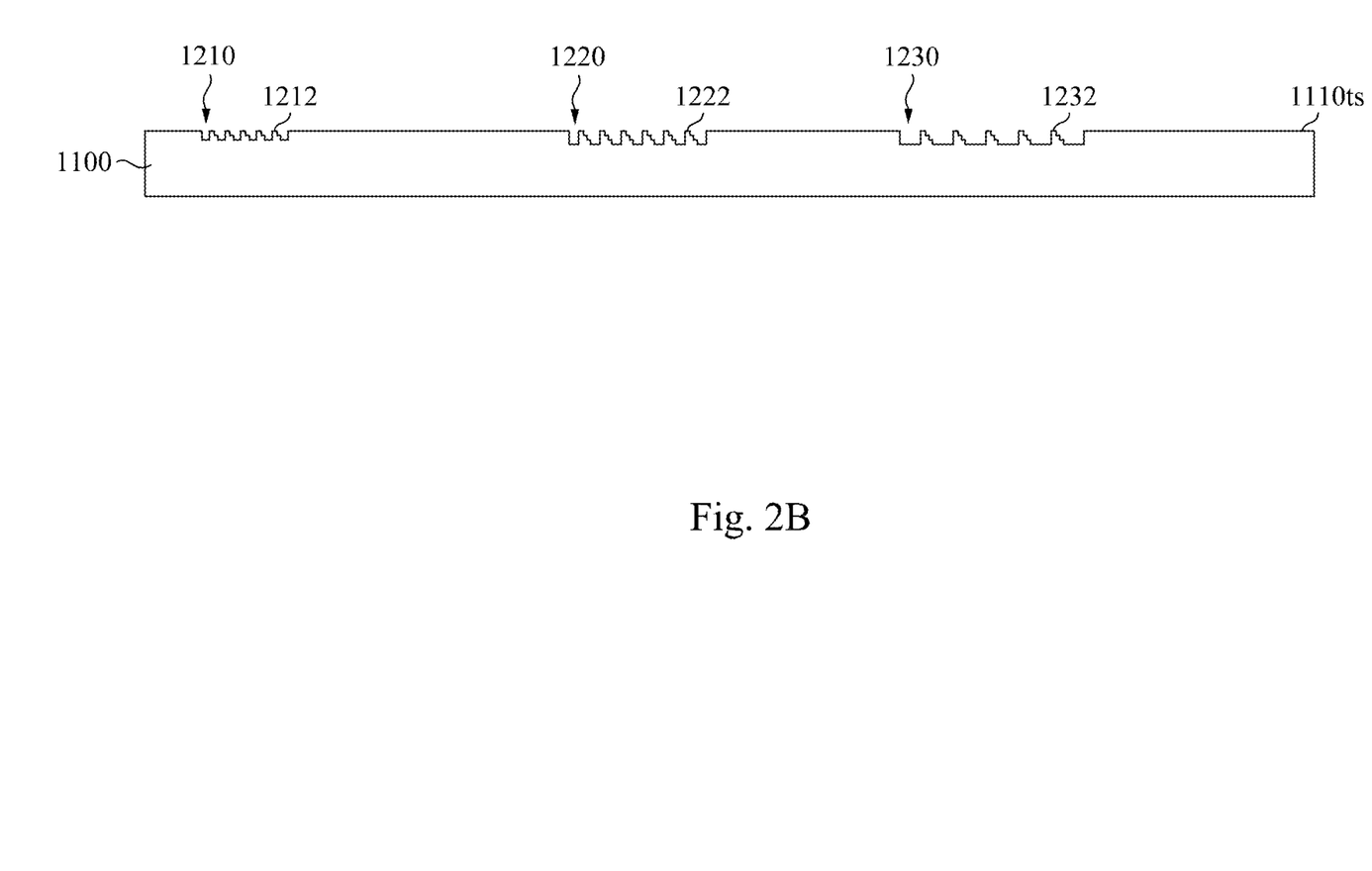
FIG. 2B is a lightguide substrate and an upper grating layer of a spectrometer in accordance with other embodiments of the present disclosure.

With reference to FIG. 2B, FIG. 2B is a lightguide substrate 1100 and an upper grating layer 1200 (including the first grating structure 1210, the second grating structure 1220, and the third grating structure 1230) of a spectrometer in accordance with other embodiments of the present disclosure. In other embodiments, the first grating structure 1210 may be located on a concave portion of lightguide substrate 1100, and thus the surface 1212 of the first grating structure 1210 may be substantially coplanar with the top surface 1110ts of the lightguide substrate 1100, as shown in FIG. 2B.

As shown in FIG. 3B, the second grating structure unit 1220u is a 3 steps grating structure and is configured to receive near-infrared (NIR) light of the light L. In some embodiments, the second grating structure unit 1220u can receive the wavelength in a range from 600 nm to 1020 nm and provide a high coupling efficiency with the configuration of the lightguide substrate 1100. Specifically, the second grating structure unit 1220u could provide a high coupling efficiency of the first order (T1) diffraction when the wavelength is in a range from 600 nm to 1020 nm. The second grating structure unit 1220u has a sidewall 1221, a surface 1222, a sidewall 1223, a surface 1224, a sidewall 1225, a surface 1226, and a sidewall 1227. In one embodiment, a ratio of a width of the surface 1222, a width of the surface 1224, a width of the surface 1226, and a gap G2 is 1:1:1:1, as shown in FIG. 3B. It should be understood that other ratios of the width of the surface 1222, the width of the surface 1224, the width of the surface 1226, and the gap G2 are also included in the present disclosure. In some embodiments, a height H2 of the sidewall 1221 is in a range from 0.1 μm to 1 μm, for example, 0.6 μm. In some embodiments, a grating period P2 of the second grating structure 1220 is in a range from 0.6 μm to 0.7 μm, such as, 0.61, 0.62, 0.63, 0.64, 0.65, 0.66, 0.67, 0.68, or 0.69 μm. It should be understood that the grating period P2 herein refers to a distance between corresponding sidewalls 1221 of two adjacent second grating structure units 1220*u*, as shown in FIG. 1. In some embodiments, the surface 1222 of the second grating structure 1220 is higher than the top surface 1110*ts* of the lightguide substrate 1100, as shown in FIG. 1. In other embodiments, the second grating structure 1220 may be located on a concave portion of lightguide substrate 1100, and thus the surface 1222 of the second grating structure 1220 may be substantially coplanar with the top surface 1110*ts* of the lightguide substrate 1100, as shown in FIG. 2B.

Figure 3E:
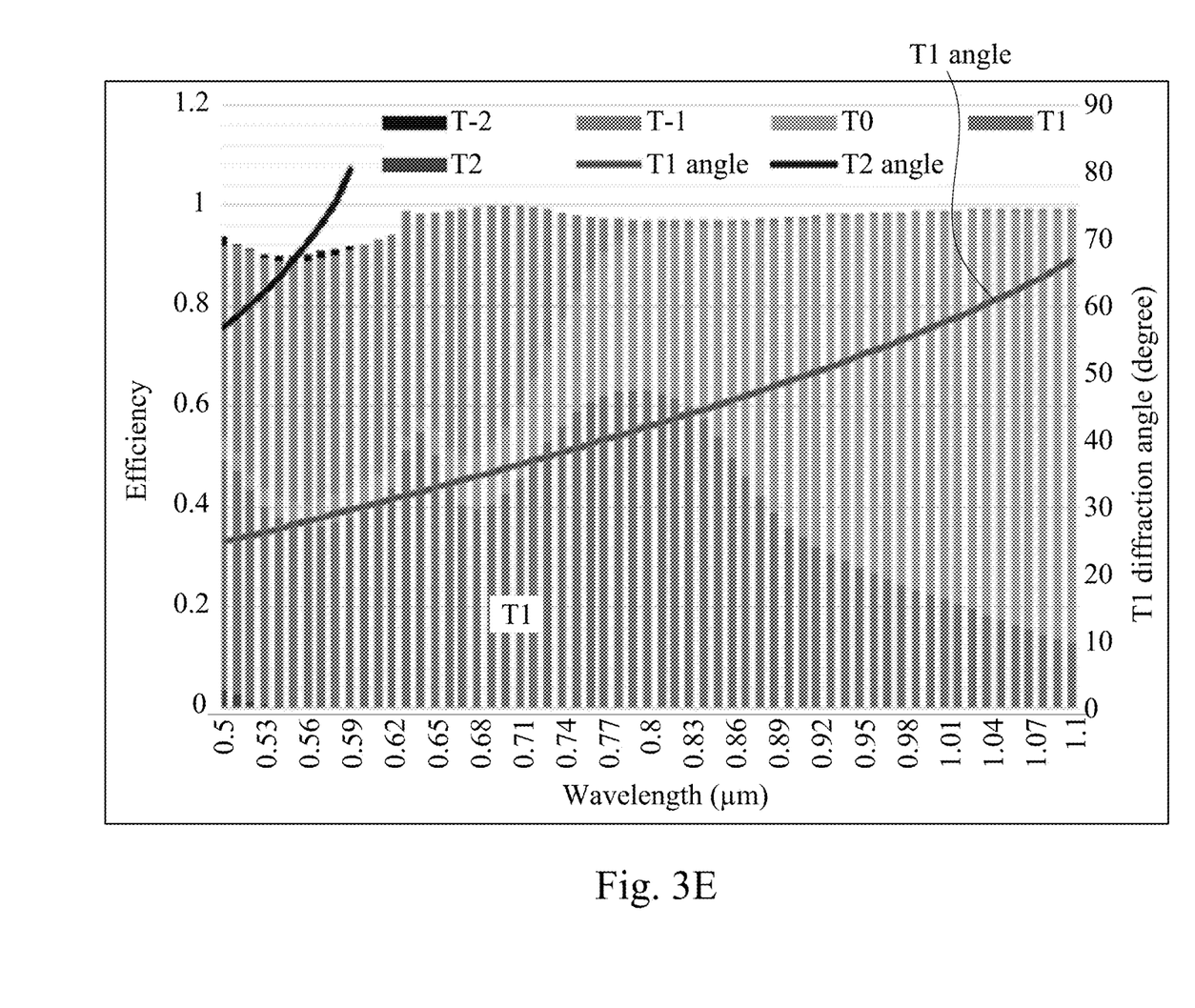

With reference to FIG. 3E, FIG. 3E is a result picture of the second grating structure unit 1220*u* in FIG. 3B in accordance with one example of the present disclosure. Specifically, in the case of the height H2 is 0.6 μm, and the ratio of the width of the surface 1222, the width of the surface 1224, the width of the surface 1226, and the gap G2 is 1:1:1:1, the second grating structure unit 1220*u* can allow most of T1 diffraction light within the wavelength between 600 nm to 1020 nm propagating into the lightguide substrate 1100 and inhibit high order diffraction light (such as T2 diffraction light) propagating into the lightguide substrate 1100, as shown in FIG. 3E.

As shown in FIG. 3C, the third grating structure unit 1230*u* is a 3 steps grating structure and is configured to receive short-wave infrared (SWIR) light of the light L. In some embodiments, the third grating structure unit 1230*u* can receive the wavelength in a range from 950 nm to 1600 nm and provide a high coupling efficiency with the configuration of the lightguide substrate 1100. Specifically, the third grating structure unit 1230*u* could provide a high coupling efficiency of the first order (T1) diffraction when the wavelength is in a range from 950 nm to 1600 nm. The third grating structure unit 1230*u* has a sidewall 1231, a surface 1232, a sidewall 1233, a surface 1234, a sidewall 1235, a surface 1236, and a sidewall 1237. In some embodiments, a ratio of a height of the sidewall 1233, a height of the sidewall 1235, and a height of the sidewall 1237 is 1:1:1. In one embodiment, a ratio of a width of the surface 1232, a width of the surface 1234, a width of the surface 1236, and a gap G3 is 1:1:1:1, as shown in FIG. 3C. It should be understood that other ratios of the width of the surface 1232, the width of the surface 1234, the width of the surface 1236, and the gap G3 are also included in the present disclosure. In some embodiments, a height H3 of the sidewall 1231 is in a range from 0.1 μm to 1 μm, for example, 0.6 μm. In some embodiments, a grating period P3 of the third grating structure 1230 is in a range from 0.95 μm to 1.05 μm, such as, 0.96, 0.97, 0.98, 0.99, 1.00, 1.01, 1.02, 1.03, or 1.04 μm. It should be understood that the grating period P3 herein refers to a distance between corresponding sidewalls 1231 of two adjacent third grating structure units 1230*u*, as shown in FIG. 1. In some embodiments, the surface 1232 of the third grating structure 1230 is higher than the top surface 1110*ts* of the lightguide substrate 1100, as shown in FIG. 1. In other embodiments, the third grating structure 1230 may be located on a concave portion of lightguide substrate 1100, and thus the surface 1232 of the third grating structure 1230 may be substantially coplanar with the top surface 1110*ts* of the lightguide substrate 1100, as shown in FIG. 2B.

Figure 3F:
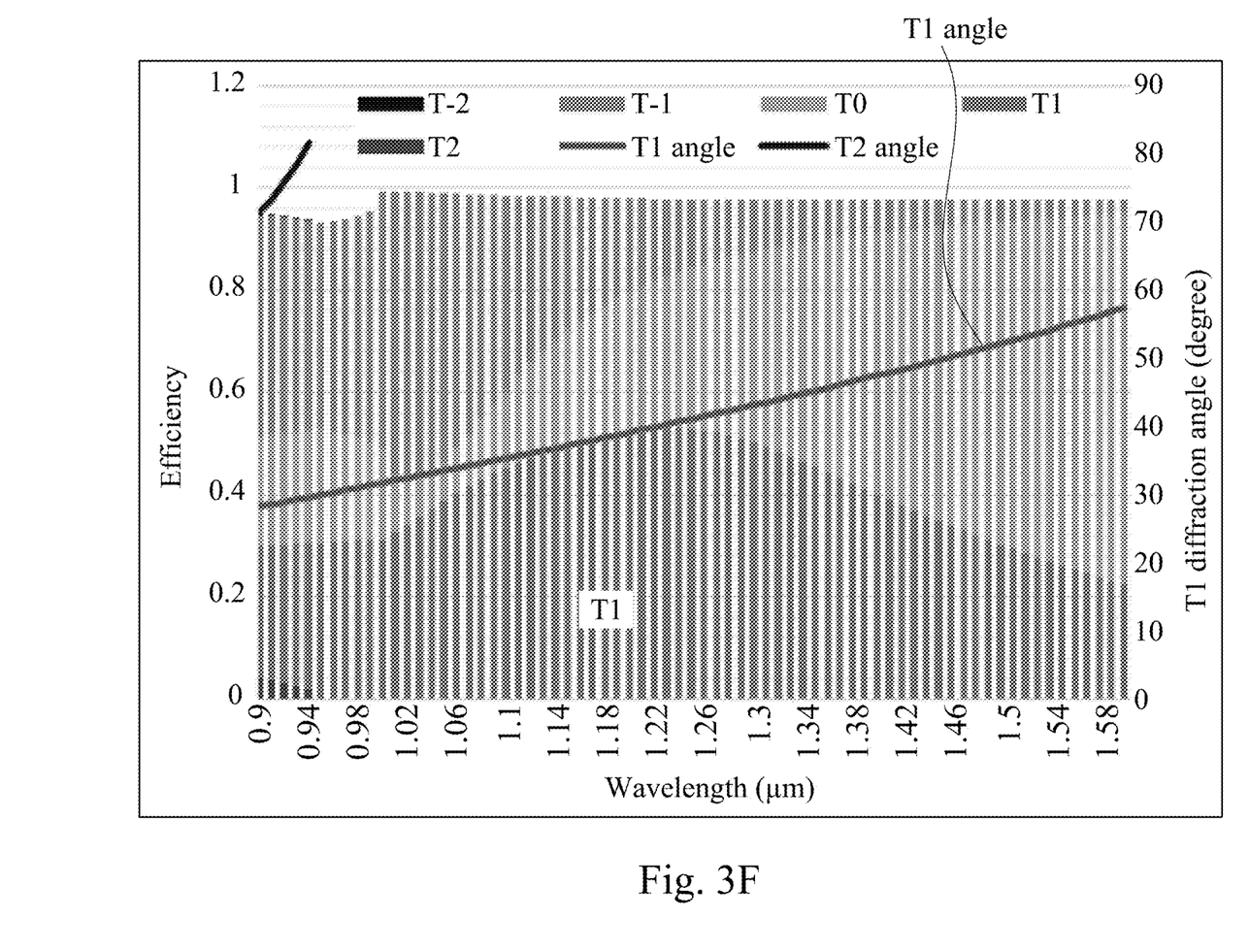

With reference to FIG. 3F, FIG. 3F is a result picture of the third grating structure unit 1230*u* in FIG. 3C in accordance with one example of the present disclosure. Specifically, in the case of the height H3 is 0.6 μm, and the ratio of the width of the surface 1232, the width of the surface 1234, the width of the surface 1236, and the gap G3 is 1:1:1:1, the third grating structure unit 1230*u* can allow most of T1 diffraction light within the wavelength between 950 nm to 1600 nm propagating into the lightguide substrate 1100 and inhibit high order diffraction light (such as T2 diffraction light) propagating into the lightguide substrate 1100, as shown in FIG. 3F.

In some embodiments, the height H1 of the sidewall 1211 of the first grating structure unit 1210*u* in FIG. 3A, the height H2 of the sidewall 1221 of the second grating structure unit 1220*u* in FIG. 3B, and the height H3 of the sidewall 1231 of the third grating structure unit 1230*u* in FIG. 3C are different. Preferably, in some embodiments, the height H1 of the sidewall 1211 of the first grating structure unit 1210*u* in FIG. 3A, the height H2 of the sidewall 1221 of the second grating structure unit 1220*u* in FIG. 3B, and the height H3 of the sidewall 1231 of the third grating structure unit 1230*u* in FIG. 3C are the same when considering the manufacturing process of the upper grating layer 1200. In some embodiments, each of the heights of the sidewall 1213, the sidewall 1215, the sidewall 1223, the sidewall 1225, the sidewall 1227, the sidewall 1233, the sidewall 1235, the sidewall 1237 are the same. For example, the height of the sidewall 1215 is equal to the sum of the height of the sidewall 1225 and the height of the sidewall 1227. The height of the sidewall 1215 is equal to the sum of the height of the sidewall 1235 and the height of the sidewall 1237. The sum of the height of the sidewall 1225 and the height of the sidewall 1227 is equal to the sum of the height of the sidewall 1235 and the height of the sidewall 1237.

It is noticed that the structure of the second grating structure 1220 and the third grating structure 1230 are the same, but the grating period P2 in the second grating structure 1220 and the grating period P3 in the third grating structure 1230 are different. In some embodiments, the second grating structure 1220 and the third grating structure 1230 have a same height. In another embodiment, the first grating structure 1210, the second grating structure 1220 and the third grating structure 1230 have a same height. Larger grating period has larger T1 diffraction wavelength. Specifically, T1 diffraction wavelength (950 nm to 1600 nm) of the third grating structure 1230 having the grating period P3 is greater than T1 diffraction wavelength (600 nm to 1020 nm) of the second grating structure 1220 having the grating period P2. T1 diffraction wavelength (600 nm to 1020 nm) of the second grating structure 1220 having the grating period P2 is greater than T1 diffraction wavelength (350 nm to 610 nm) of the first grating structure 1210 having the grating period P1. In some embodiments, each step of the grating structure (the first grating structure 1210, the second grating structure 1220, and the third grating structure 1230) for different periods may have the same height for easy fabrication.

With the structure of the first grating structure 1210, the second grating structure 1220, and the third grating structure 1230, the spectrometer 1000 allows a majority of the first order (T1) diffraction of the light L to propagate into the lightguide substrate 1100, and fulfill the broadband spectrum dispersion with T1 diffraction. The high order diffraction signals (such as the second order (T2), the third order (T3), or other high order of the light L) would be filtered out by a bandpass filter layer 1700 (the bandpass filter layer 1700 will be described below). Therefore, the spectrometer 1000 is suitable for first order (T1) diffraction of the light L in spectrum analysis.

Please refer to FIG. 1 again. The lower grating layer 1300 is disposed under the lightguide substrate 1100 and is configured to emit the multiple diffraction lights L1-L12. Specifically, the lower grating layer 1300 is disposed on a bottom surface 1120*bs* of the lightguide substrate 1100. It is understood that the lower grating layer 1300 is a mirror structure of the upper grating layer 1200. In other words, the lower grating layer 1300 includes the first grating structure 1210, the second grating structure 1220, and the third grating structure 1230. Reference numerals are repeated herein to show the same or similar features and the details thereof are not repeatedly described.

Still refer to FIG. 1. The image sensor 1400 is disposed under the lower grating layer 1300. The image sensor 1400 is configured to detect the information of the light L and convey the information into signals. As shown in FIG. 1, in some embodiments, the image sensor 1400 is a quantum dot image sensor, a Perovskite image sensor, or an organic photodiode image sensor. The image sensor 1400 sequentially includes an encapsulation layer 1410, a top transparent conductive layer 1420, an electron or hole transporting layer 1430, a photo active layer 1440, and a hole/electron transporting layer 1450. The readout circuit 1500 is disposed under the image sensor 1400. In some embodiments, the readout circuit 1500 is a Si complementary metal oxide semiconductor (CMOS) readout circuit. In some embodiments, the readout circuit 1500 is a thin film transistor (TFT) readout circuit.

Figure 4A:
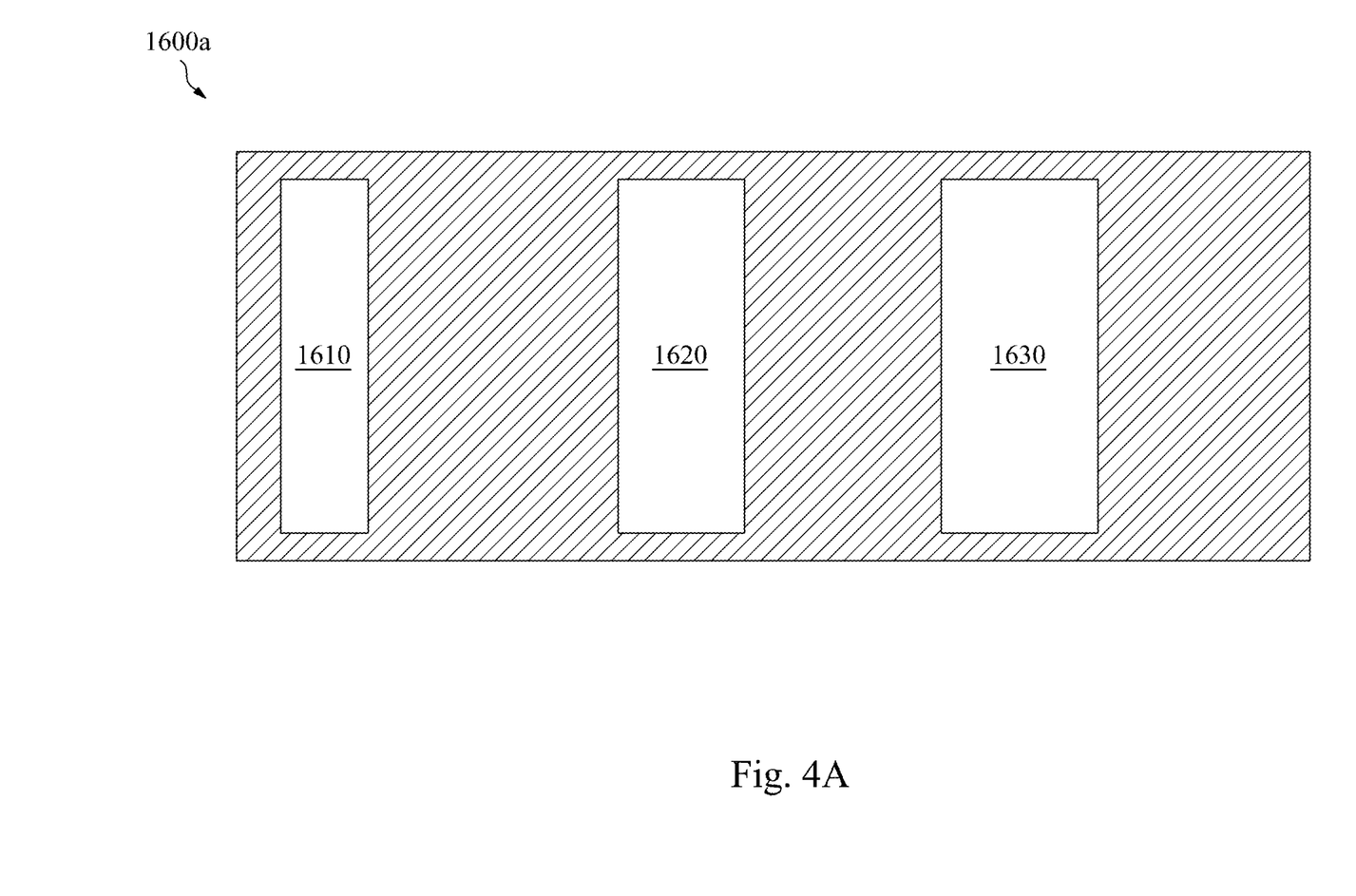
FIG. 4A and FIG. 4B are top views of a collimator of the spectrometer in FIG. 1.
Figure 4B:
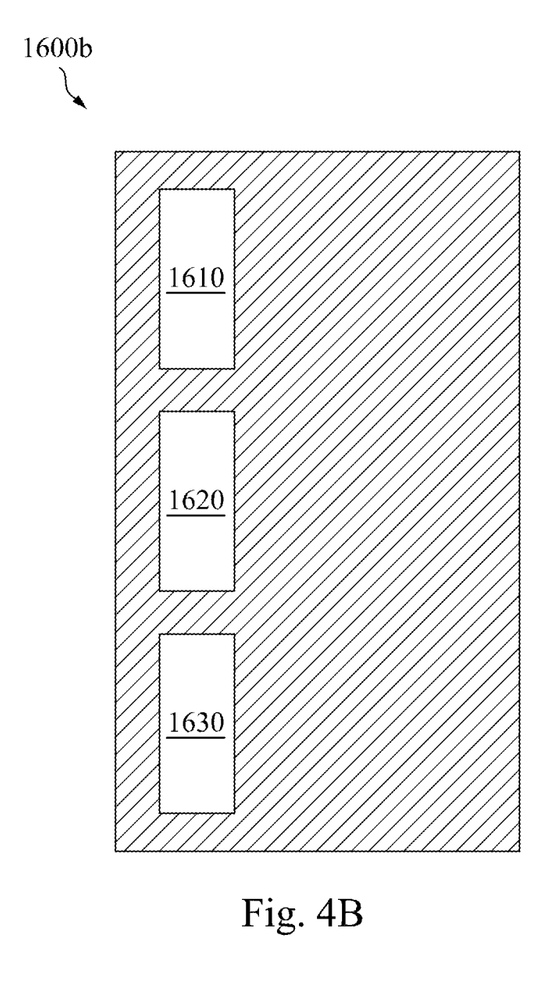

The spectrometer 1000 in FIG. 1 further includes a collimator 1600 disposed above the lightguide substrate 1100. The collimator 1600 is configured to confine an incident angle of the light L. With reference to FIG. 4A and FIG. 4B, FIG. 4A and FIG. 4B are top views of the collimator 1600 of the spectrometer in FIG. 1. The collimators 1600a, 1600b include at least three openings (a first opening 1610, a second opening 1620, and a third opening 1630) respectively aligned the first grating structure 1210, the second grating structure 1220, and the third grating structure 1230, as shown in FIG. 1. In some embodiments, the incident angle of the light L is in a range between ±2 degrees or smaller. When the incident angle of the light L is 0 degree, the light L is vertical to the top surface 1110ts of the lightguide substrate 1100. If the incident angle of the light L is greater than ±2 degrees or smaller, the resulted resolution of the light L may be decreased.

The spectrometer 1000 in FIG. 1 further includes the bandpass filter layer 1700 disposed between the lower grating layer 1300 and the image sensor 1400. In some embodiments, an air cladding layer is disposed between the lower grating layer 1300 and the bandpass filter layer 1700. In some embodiments, a low-n bottom cladding layer 1800 is disposed between the lower grating layer 1300 and the bandpass filter layer 1700. A refractive index of the bottom cladding layer 1800 is in a range from 1.0 to 1.7. In some embodiments, a thickness of the bottom cladding layer 1800 is in a range from 0.1 μm to 5 mm. In some embodiments, a low-n top cladding layer 1900 is disposed between the collimator 1600 and the lightguide substrate 1100. A refractive index of the top cladding layer 1900 is in a range from 1.0 to 1.7. The bandpass filter layer 1700 includes a first bandpass filter 1710, a second bandpass filter 1720, and a third bandpass filter 1730, which are configured to filter out high order diffraction signals, such as the second order (T2) or the third order (T3) of the light L, in different wavelength regions. The first bandpass filter 1710 includes a blue filter 1712, a green filter 1714, and a red filter 1716. The second bandpass filter 1720 includes a first near-infrared filter 1722 and a second near-infrared filter 1724. The third bandpass filter 1730 includes a first short-wave infrared filter 1732 and a second short-wave infrared filter 1734. In some embodiments, the bandpass filter layer 1700 includes a long pass filter. In some embodiments, the bandpass filter layer 1700 is composed by an organic absorption type filter or an inorganic multi-film interference type filter.

Please refer to FIG. 1. After the light L having various wavelengths passes through the collimator 1600 and the upper grating layer 1200, the light L would propagate into the lightguide substrate 1100, and then a first order (T1) diffraction angle $\theta_{T1}$ shown in FIG. 1 is formed. Each of the diffraction lights L1-L12 has a T1 diffraction angle $\theta_{T1}$, and the light with longer wavelength has a greater T1 diffraction angle $\theta_{T1}$. The diffraction angle $\theta_{T1}$ of each of the diffraction lights L1-L12 depends on the wavelength of the light L (photon). It should be notices that the diffraction lights L1-L12 illustrated in FIG. 1 only undergo once optical paths (N=1). In other words, the diffraction lights L1-L12 does not occur total internal reflection in the lightguide substrate 1100. After the diffraction lights L1-L12 pass through the lightguide substrate 1100, the diffraction lights L1-L12 pass through the lower grating layer 1300 and the bandpass filter layer 1700. Specifically, the diffraction lights L1-L4 include UV light wavelengths and visible light wavelengths, in which the diffraction lights L1 passes through the blue filter 1712, the diffraction lights L2 passes through the green filter 1714, and the diffraction lights L3-L4 pass through the red filter 1716. The diffraction lights L5-L8 include near-infrared (NIR) light wavelengths, in which the diffraction lights L5-L6 pass through the first near-infrared filter 1722, and the diffraction lights L7-L8 pass through the second near-infrared filter 1724. The diffraction lights L9-L12 include short-wave infrared (SWIR) light wavelengths, in which the diffraction lights L9-L10 pass through the first short-wave infrared filter 1732, and the diffraction lights L11-L12 pass through the second short-wave infrared filter 1734. After the diffraction lights L1-L12 pass through the bandpass filter layer 1700, the diffraction lights L1-L12 sequentially pass through the image sensor 1400 and the readout circuit 1500.

Same features are labeled by the same numerical references, and descriptions of the same features are not repeated in the following figures. It should be understood that some elements (for example, the collimator 1600 of FIG. 1) are not illustrated in the following figures for clarity.

Figure 5:
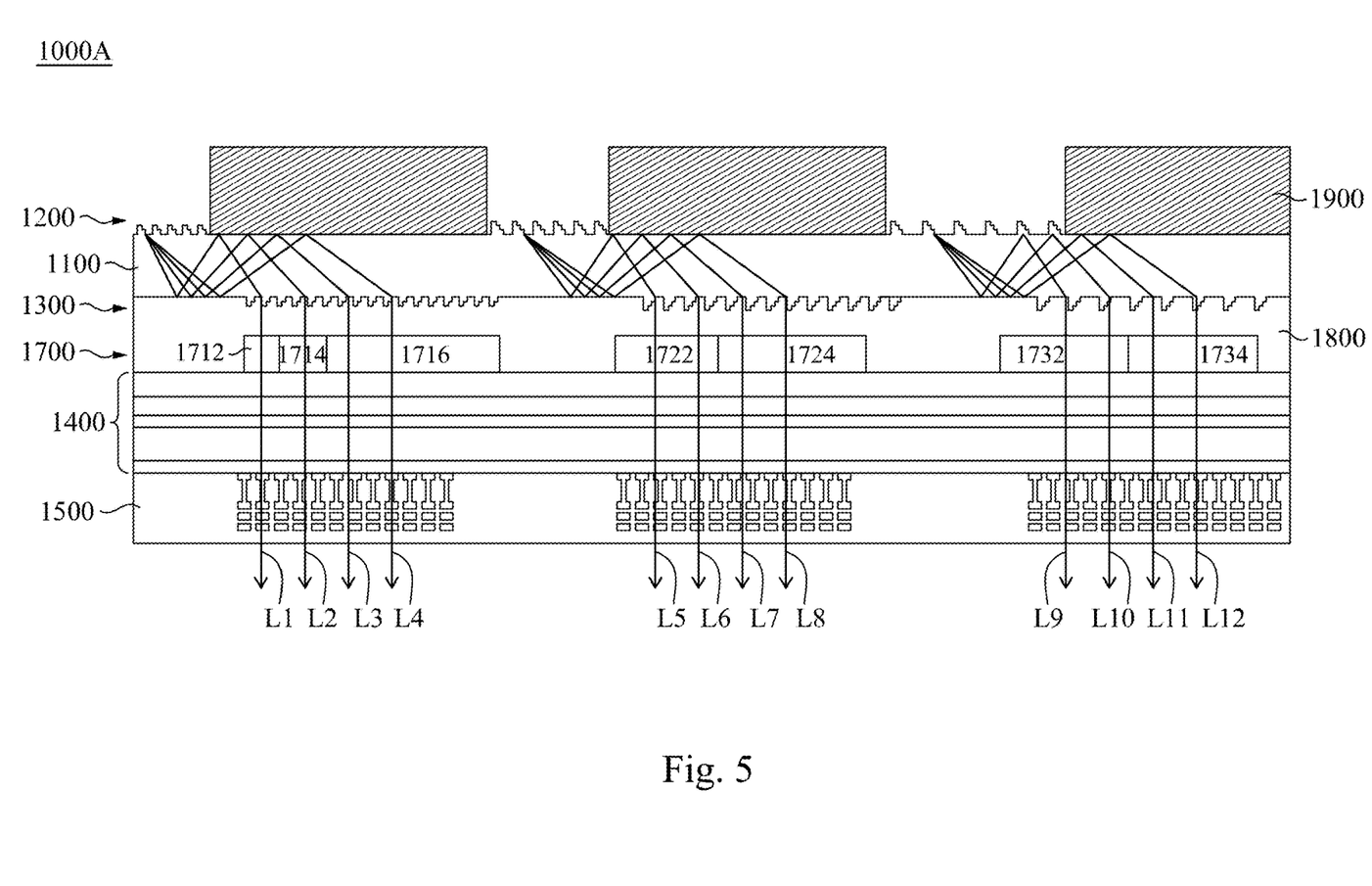
FIG. 5 is a cross-sectional view of a spectrometer in accordance with some embodiments of the present disclosure.

With reference to FIG. 5, FIG. 5 is a cross-sectional view of a spectrometer 1000A in accordance with some embodiments of the present disclosure. It should be understood that the structure of the spectrometer 1000 in FIG. 1 is similar to the structure of spectrometer 1000A in FIG. 5, but the optical paths of the diffraction lights L1-L12 are different. Specifically, the optical paths of the diffraction lights L1-L12 in FIG. 1 is one time (N=1), and the optical paths of the diffraction lights L1-L12 in FIG. 5 is three times (N=3). In details, the optical paths of the diffraction lights L1-L12 in FIG. 5 undergo twice total internal reflections after propagating into the lightguide substrate 1100, and then grating out by the lower grating layer 1300. Compared to once optical paths (N=1), three times optical paths (N=3) could improve the spatial resolution, which is because the optical path differences between different wavelengths are increased.

Figure 6:
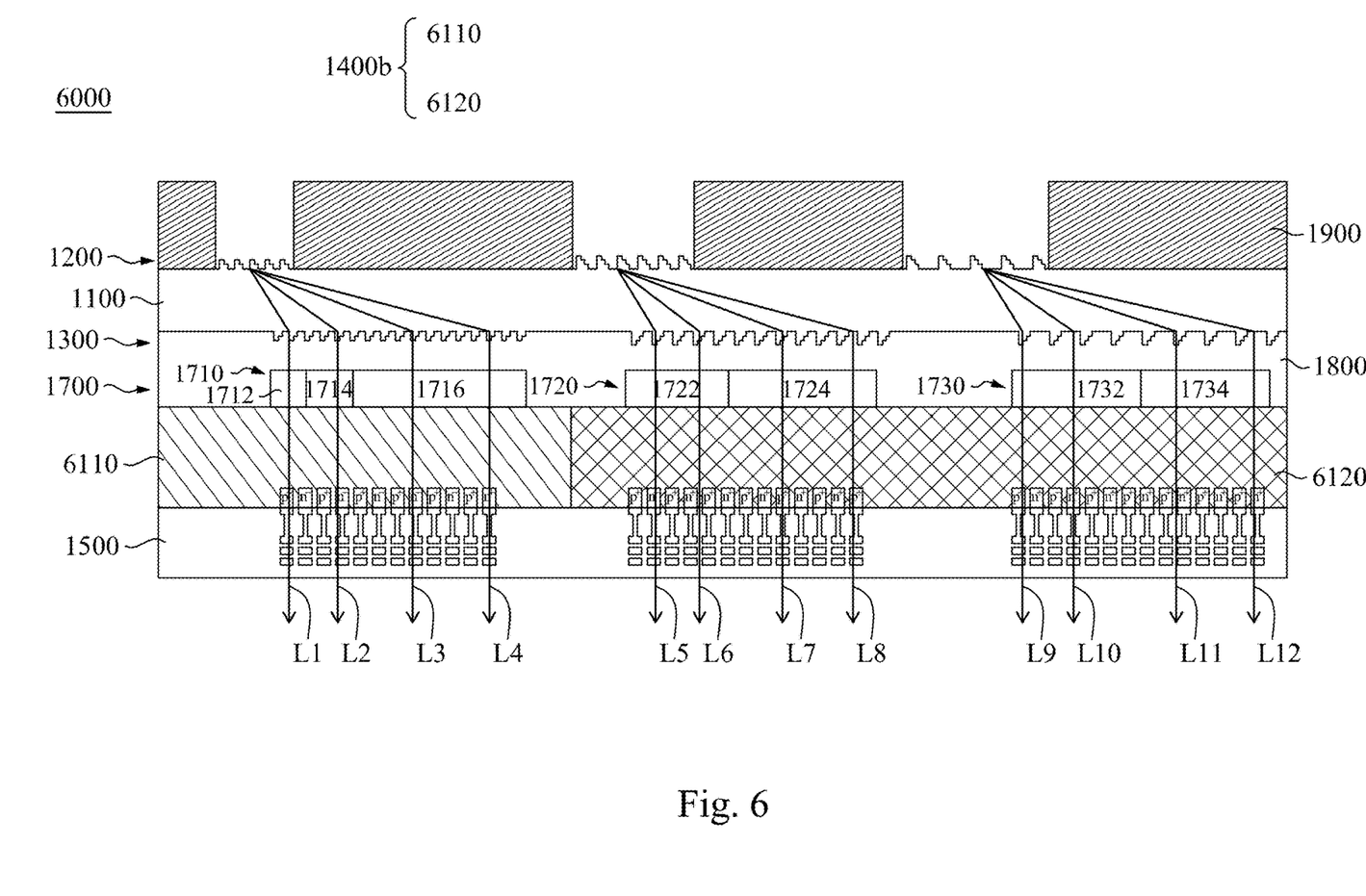
FIG. 6 is a cross-sectional view of a spectrometer in accordance with alternative embodiments of the present disclosure.

With reference to FIG. 6, FIG. 6 is a cross-sectional view of a spectrometer 6000 in accordance with alternative embodiments of the present disclosure. The difference between the spectrometer 1000 in FIG. 1 and the spectrometer 6000 in FIG. 6 is the image sensor 1400. In some embodiments, the image sensor 1400b in FIG. 6 includes a Si photodiode array 6110 and a Ge on Si photodiode array 6120 laterally overlapping the Si photodiode array 6110. Specifically, the Si photodiode array 6110 is disposed under the first bandpass filter 1710, the Ge on Si photodiode array 6120 is disposed under the second bandpass filter 1720 and the third bandpass filter 1730. The Si photodiode array 6110 is configured to detect the information of the diffraction lights L1-L4, and the Ge on Si photodiode array 6120 is configured to detect the information of the diffraction lights L5-L12.

Figure 7:
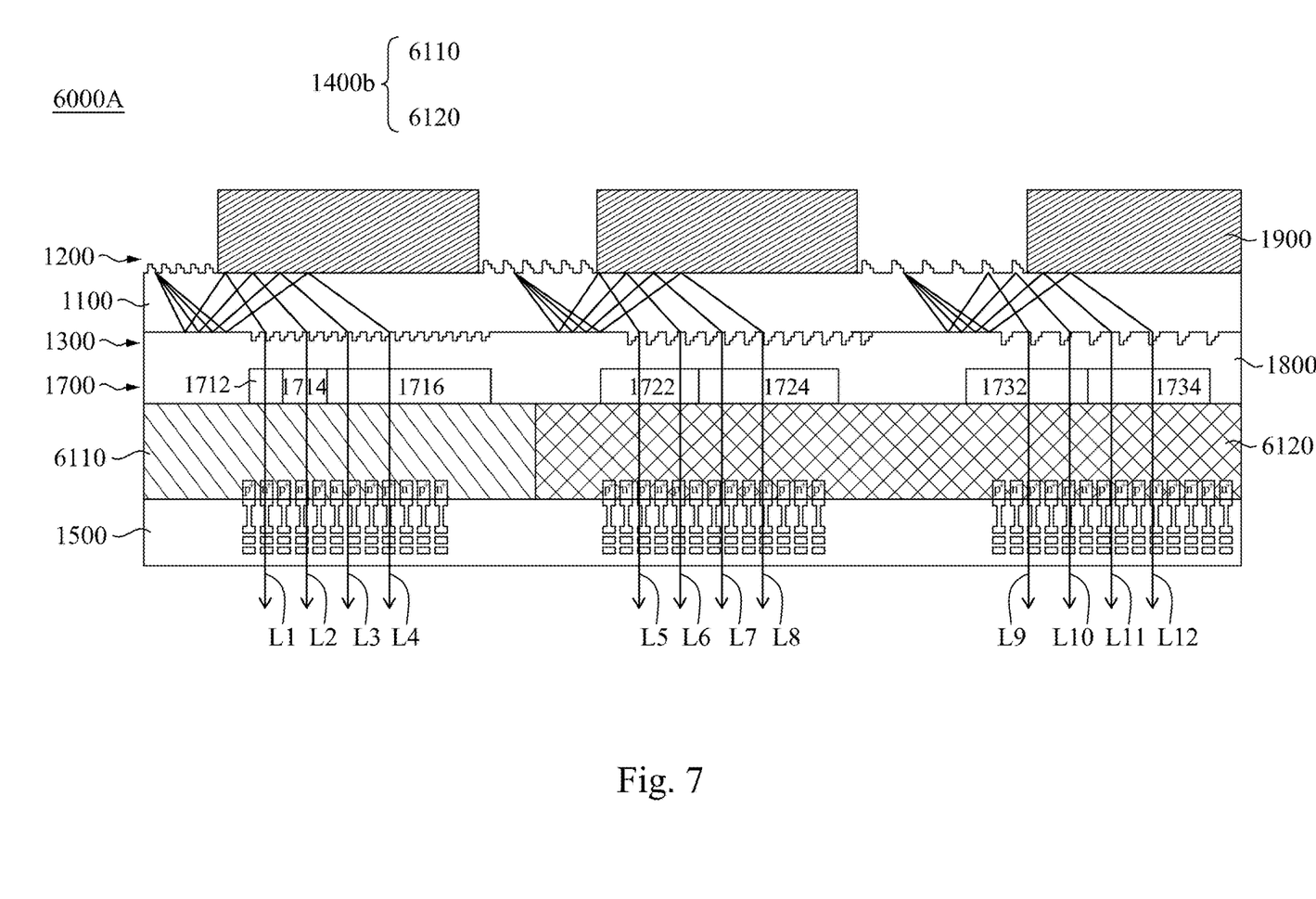
FIG. 7 is a cross-sectional view of a spectrometer in accordance with alternative embodiments of the present disclosure.

With reference to FIG. 7, FIG. 7 is a cross-sectional view of a spectrometer 6000A in accordance with alternative embodiments of the present disclosure. It should be understood that the structure of the spectrometer 6000 in FIG. 6 is similar to the structure of spectrometer 6000A in FIG. 7, but the optical paths of the diffraction lights L1-L12 are different. Specifically, the optical paths of the diffraction lights L1-L12 in FIG. 6 is one time (N=1), and the optical paths of the diffraction lights L1-L12 in FIG. 7 is three times (N=3). Compared to once optical paths (N=1), three times optical paths (N=3) could improve the spatial resolution, which is because the optical path differences between different wavelengths are increased.

The present disclosure provides a spectrometer, and the spectrometer can measure a broadband spectrum from ultra-violet-visible-infrared light. The disclosed spectrometer includes at least three grating structures having multiple steps and different grating periods. The disclosed spectrometer also has a high coupling efficiency of a grating structure and a planer waveguide (lightguide substrate).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A spectrometer, comprising:
   a lightguide substrate;
   an upper grating layer disposed on the lightguide substrate and configured to receive a light,
   wherein the upper grating layer comprises a first grating structure, a second grating structure, and a third grating structure, and the first, second, and third grating structures have different grating periods, wherein the first grating structure is a 2 steps grating structure and is configured to receive UV light and visible light,
   wherein the lightguide substrate is configured to diffract the light when the light propagates into the lightguide substrate, such that multiple diffraction lights are formed and each of the multiple diffraction lights has different wavelengths and different optical path;
   a lower grating layer disposed under the lightguide substrate and configured to emit the multiple diffraction lights;
   an image sensor disposed under the lower grating layer; and
   a readout circuit disposed under the image sensor.

2. The spectrometer of claim 1, wherein a grating period of the first grating structure is in a range from 0.3 μm to 0.4 μm.

3. The spectrometer of claim 1, the second grating structure is a 3 steps grating structure and is configured to receive near-infrared light.

4. The spectrometer of claim 3, wherein a grating period of the second grating structure is in a range from 0.6 μm to 0.7 μm.

5. The spectrometer of claim 1, the third grating structure is a 3 steps grating structure and is configured to receive short-wave infrared light.

6. The spectrometer of claim 5, wherein a grating period of the third grating structure is in a range from 0.95 μm to 1.05 μm.

7. The spectrometer of claim 1, further comprising a collimator disposed above the lightguide substrate, wherein the collimator is configured to confine an incident angle of the light, and the collimator comprises at least three openings respectively aligned the first grating structure, the second grating structure, and the third grating structure.

8. The spectrometer of claim 7, wherein the collimator is configured to confine the incident angle of the light in a range between ±2 degrees or smaller.

9. The spectrometer of claim 7, further comprising a top cladding layer disposed between the collimator and the lightguide substrate.

10. The spectrometer of claim 1, wherein a thickness of the lightguide substrate is in a range from 100 μm to 2 mm.

11. The spectrometer of claim 1, wherein the first grating structure, the second grating structure, and the third grating structure have a same height.

12. The spectrometer of claim 1, wherein a refractive index of the upper grating layer is in a range from 1.5 to 2.7.

13. The spectrometer of claim 1, wherein a refractive index of the lightguide substrate is in a range from 1.5 to 2.7.

14. The spectrometer of claim 1, wherein a material of the upper grating layer is the same as a material of the lightguide substrate.

15. The spectrometer of claim 1, wherein a material of the upper grating layer is different from a material of the lightguide substrate.

16. The spectrometer of claim 1, wherein the image sensor is a quantum dot image sensor, a Perovskite image sensor, or an organic photodiode image sensor.

17. The spectrometer of claim 1, wherein the image sensor comprises a Si photodiode array and a Ge on Si photodiode array laterally overlapping the Si photodiode array.

18. The spectrometer of claim 1, further comprising a bandpass filter layer disposed between the lower grating layer and the image sensor.

19. The spectrometer of claim 18, further comprising a bottom cladding layer disposed between the lower grating layer and the bandpass filter layer.

* * * * *